United States Patent [19]

Ina et al.

[11] Patent Number: 4,883,359
[45] Date of Patent: Nov. 28, 1989

[54] ALIGNMENT METHOD AND PATTERN FORMING METHOD USING THE SAME

[75] Inventors: Hideki Ina, Kanagawa; Akiyoshi Suzuki, Tokyo, both of Japan

[73] Assignee: Canon Kabushiki Kaisha, Tokyo, Japan

[21] Appl. No.: 186,773

[22] Filed: Apr. 25, 1988

Related U.S. Application Data

[63] Continuation-in-part of Ser. No. 120,165, Nov. 12, 1987, abandoned, which is a continuation of Ser. No. 57,649, Jun. 9, 1987, abandoned, which is a continuation of Ser. No. 705,523, Feb. 26, 1985, abandoned, which is a continuation-in-part of Ser. No. 125,827, Nov. 25, 1987, abandoned, which is a continuation of Ser. No. 705,537, Feb. 26, 1985, abandoned.

[30] Foreign Application Priority Data

Feb. 28, 1984 [JP] Japan .................. 59-35322
Feb. 28, 1984 [JP] Japan .................. 59-35330

[51] Int. Cl.$^4$ .................................. G01B 11/00
[52] U.S. Cl. .................... 356/401; 355/77; 430/22
[58] Field of Search ............ 356/399, 400, 401; 355/43, 53, 54, 77; 250/557; 430/22, 394

[56] References Cited

U.S. PATENT DOCUMENTS

| | | | |
|---|---|---|---|
| 3,694,080 | 9/1972 | Malsky | 355/53 X |
| 4,118,230 | 10/1978 | Binder | 430/394 X |
| 4,128,331 | 12/1978 | Nakamura | 355/32 |
| 4,167,677 | 9/1979 | Suzki | 356/401 |
| 4,488,806 | 12/1984 | Takehashi et al. | 355/54 |
| 4,550,374 | 10/1985 | Meshman et al. | 356/401 |
| 4,589,769 | 5/1986 | Matusuki | 355/71 |

FOREIGN PATENT DOCUMENTS

| | | |
|---|---|---|
| 54-134565 | 10/1975 | Japan . |
| 0103555 | 8/1980 | Japan .................. 355/43 |
| 57-183032 | 11/1982 | Japan . |

OTHER PUBLICATIONS

Steppan et al., "The Resist Technique-A Chemical Contribution to Electronics", *Angew. Chemie Int. Ed. Eng.*, 21 (1982), No. 7, pp. 455–469.

Potosky et al., "An Electron-Beam/Optical Hybrid Lithography . . . ", *J. Vac. Sci. Technol*, 19(4), Nov./Dec. 1981, pp. 924–946.

Berker et al., "Dual-Polarity, Single-Resist Mixed (E-Beam/Photo) Lithography", *IEEE Electron Device Letters*, vol. EDL-2(11), Nov. 1981, pp. 281–283.

Briggs et al., "Method of Artwork Generation", *IBM Technical Disclosure Bulletin*, vol. 21, No. 5, Oct. 1978, pp. 1926–1927.

*Primary Examiner*—F. L. Evans
*Attorney, Agent, or Firm*—Fitzpatrick, Cella, Harper & Scinto

[57] ABSTRACT

An alignment method and a pattern forming method using the same, wherein a substrate onto which a complete pattern is to be transferred is held by a holder having formed thereon at least two alignment marks disposed in a predetermined positional relation with each other. Separate masks having relatively complementing pattern segments are used. Each of the masks is aligned with corresponding portion of the holder through an associated one of the alignment marks. As the result, the pattern segments transferred onto the substrate is aligned with each other and the continuity of the pattern is assured on the substrate. Also provided is an alignment mark forming method and a pattern forming method using the same, wherein the region on a substrate in which a continuous pattern is to be formed is divided into at least two sections and alignment marks for these sections are simultaneously formed on the substrate by means of one single mask, so that the segments of the pattern which are first to be transferred onto the sections of the substrate can be aligned with each other when they are transferred onto the substrate.

2 Claims, 4 Drawing Sheets

ALIGNMENT METHOD AND PATTERN FORMING METHOD USING THE SAME

This application is a continuation-in-part of application Ser. No. 120,165, filed Nov. 12, 1987, now abandoned, which was a continuation of application Ser. No. 057,649, filed June 9, 1987, now abandoned, which was a continuation of application Ser. No. 705,523, filed Feb. 26, 1985, now abandoned. This application is also a continuation-in-part of application Ser. No. 125,827, filed Nov. 25, 1987, now abandoned, which is a continuation of application Ser. No. 705,537, filed Feb. 26, 1985, now abandoned.

BACKGROUND OF THE INVENTION

This invention relates generally to a method of forming a continuous or uninterrupted pattern on a relatively large area, particularly, to a method of achieving alignment between a mask and a substrate of relatively large area onto which a continuous pattern for use in the manufacture of liquid crystals, integrated circuits, charge-coupled devices, line sensors, etc. is to be formed, more particularly to a method of forming alignment marks for permitting alignment between a mask and a substrate of relatively large area onto which a continuous pattern for use in the manufacture of liquid crystals, integrated circuits, charge-coupled devices, line sensors, etc.

In the fields of manufacture of liquid crystals, integrated circuits, charge-coupled devices, line sensors and the like as mentioned above, it has recently been desired to form a continuous or uninterrupted pattern having a large area. Particularly in the field of charge-coupled devices or line sensors, it has been particularly desirable to form a continuous pattern of large area and of rectangular shape.

From a viewpoint of assuring continuity of the pattern, it would be most convenient to form an integral pattern on a substrate of large area by means of a single mask of the same size and through an optical lithography process or the like.

While a large substrate can be made without specific difficulties, manufacture of a similarly large mask is not yet practicable. This is chiefly because of technical difficulties and resultant increases in manufacturing costs.

SUMMARY OF THE INVENTION

It is accordingly a primary object of the present invention to provide a novel and unique method of forming a continuous pattern on a substrate having a relatively large area.

It is another object of the present invention to provide a novel and unique method of achieving alignment between a substrate as above and a mask during formation of a continuous pattern on the substrate.

It is another object of the present invention to provide a novel and unique method of forming alignment marks on a substrate as above for permitting alignment between the substrate and a mask during formation of a continuous pattern on the substrate.

Briefly, according to the present invention, there are provided an alignment method and a pattern forming method using the same, wherein a substrate onto which a complete pattern is to be transferred is held by a holder having formed theron at least two alignment marks disposed in a predetermined positional relation with each other. Separate masks having relatively complementing pattern segments are used. Each of the masks is aligned with a corresponding portion of the holder through an associated one of the alignment marks. As the result, the pattern segments transferred onto the substrate are aligned with each other, and the continuity of the pattern is assured on the substrate.

Further, according to the present invention, there are provided both an alignment mark forming method and a pattern forming method using the same, wherein the region on a substrate in which a continuous pattern is to be formed is divided into at least two sections and alignment marks for these sections are simultaneously formed on the substrate by means of a single mask, so that the segments of the pattern which are first to be transferred onto the sections of the substrate can be aligned with each other when they are transferred onto the substrate.

These and other objects, features and advantages of the present invention will become more apparent upon considering the following description of the preferred embodiments of the present invention taken in conjunction with the accompanying drawings.

DESCRIPTION OF THE PREFERRED EMBODIMENTS

Figure 1:
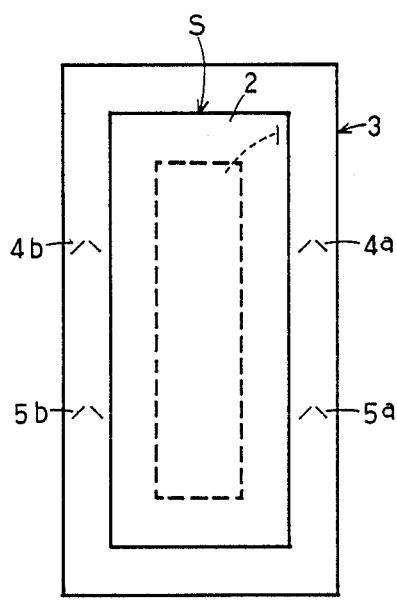
FIG. 1 is a plan view schematically showing a substrate held by a holder, in accordance with the present invention.

As described in the foregoing, manufacture of larger masks is not yet practicable. In view of this, according to the present invention, as least two masks each having a relatively small area, such as that of a currently available mask, are used to form a continuous pattern on the substrate. More specifically, the region on the same substrate onto which the continuous pattern is transferred (the region will hereinafter be referred to as "pattern transfer region") is divided into at least two sections and the pattern transfer is sequentially effected relative to the sections through the at least two masks having different pattern segments. As the result, one complete pattern is transferred onto the substrate.

The present invention also provides a method of forming alignment marks on a substrate onto which a continuous pattern is to be transferred. This method comprises forming a mask having at least two alignment marks, each of the alignment marks being effective to permit alignment between an associated one of several sections of the substrate and an associated one of several marks related to the sections on the substrate and having separate pattern segments to be transferred onto the sections on the substrate to form a continuous pattern on the substrate, while simultaneously transferring onto the substrate the alignment marks formed on the first mask with respect to different sections on the substrate.

Basically, the present invention discloses a method of forming a continuous pattern on a substrate which includes forming alignment marks on the substrate for at least two sections. A mask having a pattern segment associated with one of the sections is aligned through at least one of the masks. The pattern of the mask is transferred onto the section of the substrate associated with the mask. Another mask having a pattern segment associated with another section on the substrate is aligned through at least one other of the alignment marks formed on the substrate associated with this second mask.

The pattern segment of this mask is transferred onto the section on the substrate associated with the pattern segment, whereby the pattern segments transferred onto the substrate complement each other to form a continuous pattern on the substrate.

As is known in the art, manufacture of semiconductor circuit devices or the like requires repeated pattern transfer operations relative to the same region on the substrate, such as a wafer, with use of different masks having different circuit patterns. During repetitions of pattern transfer, these different patterns must be superposed upon one another with high overlay accuracies. In respect to the first pattern transfer using the first mask, however, essentially no positional accuracy is required since, at the time of the first pattern transfer, no pattern has yet been formed on the wafer and also since the pattern of the first mask, which is to be transferred is itself integral, and not a segment of one complete pattern.

If, on the other hand, the pattern transfer region on the substrate is divided into plural sections as in the present invention and the pattern transfer is to be sequentially effected relative to the plural sections with the use of different masks having different pattern segments, alignment must be established between the pattern segments which are to be first transferred onto the sections on the substrate, respectively. In other words, upon the first pattern transfer relative to the plural sections on the substrate, alignment between the pattern segments is required in order to ensure continuity of the pattern to be formed on the substrate.

If this is achieved, alignment between the pattern segments which are subsequently to be transferred onto the sections, respectively, of the substrate during the succeeding pattern transfer step or steps is automatically assured only by pursuing overlay accuracies between the already-transferred pattern segment and the pattern segment to be transferred onto the same section of the substrate.

Referring to FIG. 1, a substrate S such as a glass plate, silicon wafer or the like has on its surface a pattern transfer region 1 (denoted by a broken line) onto which a continuous pattern is to be transferred. In the present embodiment, the pattern transfer region 1 is divided, with respect to a center line C (FIG. 2), into an upper half section and a lower half section as will be described later.

A holder 3 releasably holds the substrate S through suitable means such as adhesion. Formed on the holder 3 are alignment marks 4a, 4b, 5a and 5b which are disposed in a preferred positional relationship with each other and with respect to the center line C (FIG. 2) of the pattern transfer region 1. The alignment marks 4a and 4b are for the upper half section of the pattern transfer region 1, while the alignment marks 5a and 5b are for the lower half section of the region 1.

Figure 5:
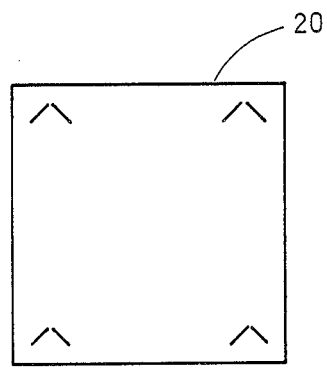
FIG. 5 is a plan view showing a mask for forming alignment marks on the holder of FIG. 1.

These alignment marks can be formed on the holder by a known optical lithographic technique with the use of a mask 20 such as shown in FIG. 5. That is, the mask 20 having formed thereon corresponding alignment marks is placed on or above the holder 3 so that the center of the mask 20 coincides with the center of the holder 3. Subsequently, the mask 20 is illuminated by an unshown illumination source, so that a photoresist coating on the holder 3 is exposed to the light beam transmitted through the mask 20. By this, the alignment marks 4a, 4b, 5a and 5b are transferred onto the holder 3. The images of the alignment marks are then visualized by a known developing process.

A suitable material is selected for the holder 3 to maintain exact positional relation between the alignment marks, independently from the surrounding conditions such as an ambient temperature.

Alignment and pattern transfer in accordance with the present invention will now be described in more detail.

First, the substrate S is held by the holder. The positioning accuracy for the substrate S relies on the mechanical positioning by the holder.

Figure 2:
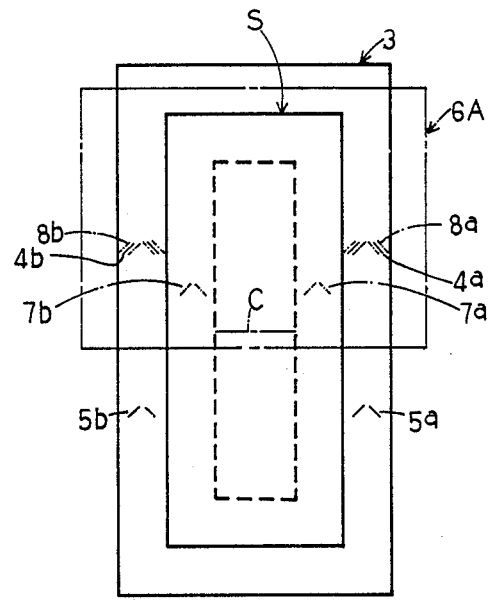
FIGS. 2 and 4 are plan views, respectively, schematically showing the manner of alignment and pattern transfer according to the present invention.
Figure 3:
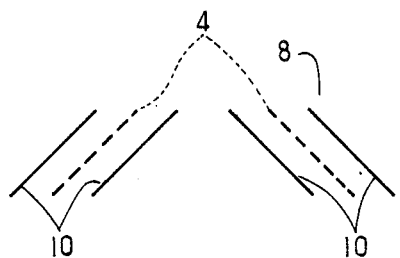
FIG. 3 is an enlarged view showing alignment marks when the alignment is achieved.
Figure 4:
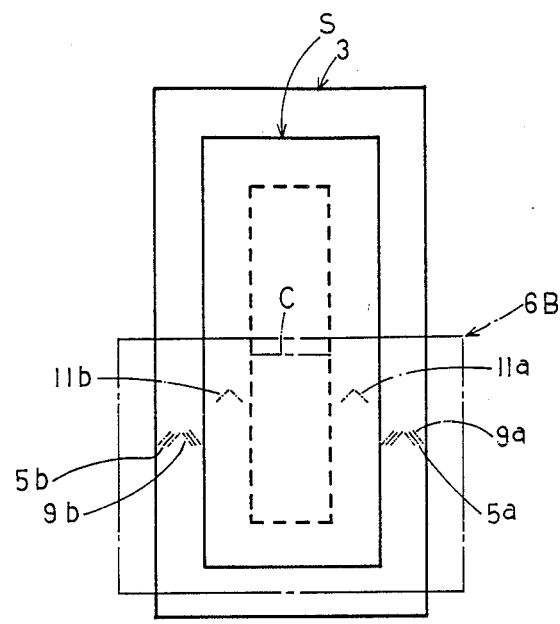

After the substrate S is positioned, the pattern transfer relative to the pattern transfer region 1 is carried out, in the manner as illustrated in FIGS. 2-4.

In the present embodiment, two real masks 6A and 6B having relatively complementing halves of one complete pattern are used in accordance with the number of the sections of the pattern transfer region 1. In addition to the segment of the circuit pattern, each of the masks 6A and 6B is formed with alignment marks 8a and 8b; or 9a and 9b corresponding to the alignment marks 4a and 4b (or 5a and 5b) on the substrate S.

The positional relationship between these alignment marks is predetermined such that: the positional relation between the alignment marks 8a, 8b, 9a and 9b on the masks 6A and 6B, which is established when these masks are placed side-by-side so that their pattern segments are exactly connected to each other to define an exactly continuous pattern, is exactly the same as or strictly coincides with the positional relation between the alignment marks 4a, 4b, 5a and 5b on the holder 3. By using a known electron beam patterning process or the like, these alignment marks 8a, 8b, and 9a and 9b can be easily formed on the masks 6A and 6B, respectively, while precisely maintaining such positional relationship as described above.

When, for example, the pattern transfer relative to the upper section of the pattern transfer region 1 is first desired, the mask 6A is placed on or above the upper half area of the substrate S and thereafter the positional adjustment of the mask 6A relative to the substrate is suitably effected through the alignment marks 4a, 4b, 8a and 8b, in a known manner such as disclosed e.g. in U.S. Pat. No. 4,167,677, until the spacings between the bar elements 10 of the alignment marks 8 and the alignment marks 4 become equal to each other, such as shown in FIG. 3. When this is achieved, a correct positional relation is established between the mask 6A and the upper half area of the substrate S, and thus the exposure of the upper half area of the substrate is effected. By this, the pattern segment formed on the mask 6A is transferred onto the upper half sections on the pattern transfer region 1. During this exposure, the lower half area of the substrate is preferably protected against the exposure beam by a suitable blocking member.

Subsequently, a similar pattern transfer process is effected relative to the lower section of the pattern transfer region 1. This may be carried out either after or prior to the treatment of the photoresist material with respect to the upper section of the region 1.

After the first pattern transfer relative to the upper and lower sections of the region 1 through the masks 6A and 6B is completed, the substrate S is detached from the holder 3.

As is shown in FIGS. 2 and 4, each of the masks 6A and 6B has additional alignment marks 7a and 7b (or 11a and 11b). During exposure of the substrate S, these alignment marks are simultaneously transferred onto a region 2 (see FIG. 1) on the substrate S between its outer boundary and the pattern transfer region 1. The thus transferred alignment marks 7a and 7b (or 11a and 11b) are used for the purpose of achieving alignment during repetitions of pattern transfer relative to the same section of the pattern transfer region 1, i.e. attaining an overlay accuracy between the already-transferred pattern segment and the pattern segment which is just to be trasferred onto the same section.

While the degree of continuity of the pattern segments transferred onto the pattern transfer region 1 may be slightly inferior to the continuity which would be attainable with a single mask having a large area covering the region 1 if it could be practically manufactured, such slight inferiority can be fully neglected because the manufacturing accuracies required for liquid crystals, some kinds of integrated circuits, charge-coupled devices, line sensors, etc. are not so severe as compared with those required for high-capacity integrated circuits such as VLSIs, and because at least a sufficient degree of alignment between the pattern segments is satisfied by means of the alignment marks 4a, 4b and 5a, 5b.

Figure 6:
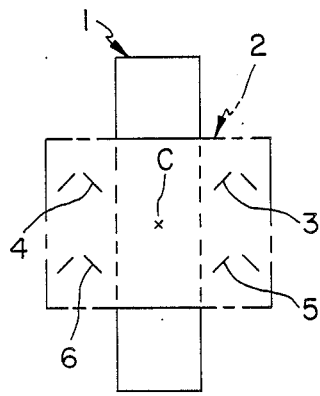
FIG. 6 is a plan view schematically showing the positional relation between a substrate and a mask when alignment marks are formed on the substrate in accordance with the present invention.

Referring to FIG. 6, a substrate such as a glass plate, silicon wafer or the like has on its surface a pattern transfer region 1 onto which a continuous pattern is to be transferred. The outer boundary of the substrate is not illustrated in the drawing only for the sake of simplicity of illustration.

Denoted by reference character C is the center (phantom point) of the pattern transfer region 1. With respect to the center C, in the present embodiment, the pattern transfer region 1 is divided into an upper half section and a lower half section as will be described later.

Designated by reference numeral 2 is a mask having a length or width approximately equal to half the length of the pattern transfer region 1, in this embodiment. On the surface of the mask 2, only alignment marks 3-6 are formed in a predetermined positional relationship with each other and with respect to the center of the mask 2. No circuit pattern is formed on the mask 2. The alignment marks 3 and 4 are for the upper half section of the pattern transfer region 1, while the alignment marks 5 and 6 are for the lower half section of the region 1.

Prior to pattern transfer relative to the pattern transfer region 1, the mask 2 is placed on or above the substrate so that the center thereof substantially coincides with the center C of the pattern transfer region 1 and so the direction connecting the alignment marks 3 and 5; or 4 and 6 becomes substantially parallel to the direction of elongation of the pattern transfer region 1. By this placement, the alignment marks 3 and 4 are located at the positions on or above the upper half area of the substrate, with respect to the center C, and on or above an area other than the pattern transfer region 1, while the alignment marks 5 and 6 are located at the positions on or above the lower half area of the substrate other than the pattern transfer region 1.

Subsequently, the mask 2 is illuminated by an illumination source (not shown), so that a photoresist coating on the substrate is exposed to the light beam transmitted through the mask 2. By this, the alignment marks 3-6 are transferred onto the substrate in the area other than the pattern transfer region 1. The images of the alignment marks 3-6 may be visualized by a known developing process.

With the above-described operation, the substrate is now provided with alignment marks for permitting alignment between the substrate and real masks having real circuit patterns.

Figure 7:
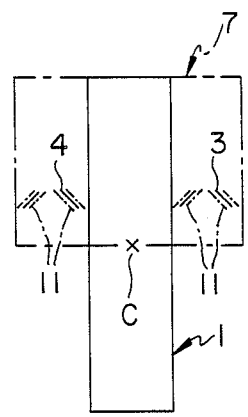
FIGS. 7 and 8 are plan views schematically showing the manner of pattern transfer in accordance with the present invention.
Figure 8:
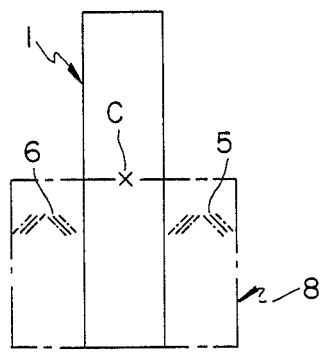
Figure 9:
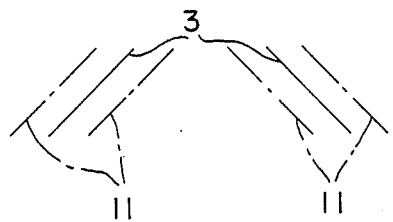
FIG. 9 is an enlarged view showing alignment marks when the alignment is achieved.

The pattern transfer relative to the pattern transfer region 1 will now be described with reference to FIGS. 7-9.

In the present embodiment, two real masks 7 and 8 having relatively complementing halves of one complete pattern are used in accordance with the number of the sections of the pattern transfer region 1. In addition to the segment of the circuit pattern, each of the masks 7 and 8 is formed with alignment marks 11 corresponding to the alignment marks 3 and 4 (or 5 and 6) on the substrate.

The positional relationship between the alignment marks 3, 4, 5, 6 and 11 is preparatively determined such that: the positional relation between the alignment marks 11 on the masks 7 and 8, which is established when the masks 7 and 8 are placed side-by-side so that their pattern segments are exactly connected to each other to define an exactly continuous pattern, is exactly the same as or strictly coincides with the positional relationship between the alignment marks 3-6. By using a known electron beam patterning process or the like, these alignment marks 3-6, 11 can be easily formed on the masks 2, 7 and 8, respectively, while precisely maintaining such positional relationship as described above.

When, for example, the pattern transfer relative to the upper section of the pattern transfer region 1 is first desired, the mask 7 is placed on or above the upper half area of the substrate and thereafter the positional adjustment of the mask 7 relative to the substrate is suitably effected through the alignment marks 3, 4 and 11, in a known manner such as disclosed, e.g., in U.S. Pat. No. 4,167,677, until the spacings between the alignment marks become equal to each other, such as shown in FIG. 9. When this is achieved, a correct positional relation is established between the mask 7 and the upper half area of the substrate, and thus the exposure of the upper half area of the substrate is effected. During this exposure, the lower half area of the substrate as well as the alignment mark 11 areas are preferably protected against the exposure beam by a suitable blocking member.

Subsequently, a similar pattern transfer process is effected relative to the lower section of the pattern transfer region 1. This may be carried out either after or prior to the treatment of the photoresist material with respect to the upper section of the region 1.

While the degree of continuity of the pattern segments transferred onto the pattern transfer region 1 may be slightly inferior to the continuity which would be attainable with a single mask having a large area covering the region 1, if such single mask could be practically manufactured, any slight inferiority can be fully neglected because the manufacturing accuracies required for liquid crystals, some kinds of integrated circuits, charge-coupled devices, line sensors, etc. are not so severe as compared with those required for high-capacity integrated circuits such as VLSIs, and because at least a sufficient degree of alignment between the pattern segments is satisfied by means of the alignment marks 3–6.

In a case where repetitions of pattern transfer relative to each of the sections of the pattern transfer region 1 are required, the pattern transfer is repeated through additional masks while achieving alignment with the already-transferred pattern by means of the alignment marks 3–6 formed on the substrate and the alignment marks formed on the additional masks in the manner similar as the alignment marks 11.

Figure 10:
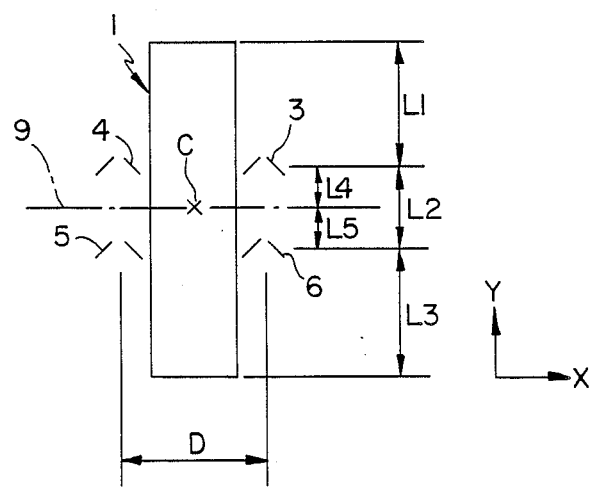
FIG. 10 is an illustration for explaining a consideration to be made upon determination of the positions of alignment marks.

FIG. 10 is an illustration for explaining a consideration which is to be made upon determination of the positions of alignment marks.

In the FIG. 10 arrangement, the alignment marks 5 and 6 are spaced from each other by a distance D, while the alignment marks 3 and 6 are spaced from the center line 9 of the region 1 by distances L4 and L5, respectively. The sum of L4 and L5 is L2. Also, the alignment marks 3 and 6 are spaced from respective edges of the region 1 by distances L1 and L3, respectively. If the alignment achieved by means of the alignment marks 3 and 4 contains an error $\pm\Delta$, the error in the rotational direction, i.e., $\Delta\theta$ can be given by $\tan^{-1}(2\Delta/D)$. Since, at this time, the upper edge of the region 1 as viewed in FIG. 10 is spaced from the alignment mark 3 through the distance L1, it is positionally deviated by $L1 \cdot \sin(\Delta\theta)$ in the direction of x and by $L1\{1-\cos(\Delta\theta)\}$ in the direction of y.

While in such case there will be no problem if the positions of the alignment marks are determined to satisfy an inequality $D > L1$, usually an inequality $D < L1$ arises due to the dimensional limitations on the region 1, particularly in the case of a line sensor having an elongated shape. For this reason, there occurs a positional deviation not less than $\pm\Delta$ at the edge portion of the pattern transfer region. In particular, the overlay accuracy at the edge portion becomes worst if L4=L5=0 (which means that only two alignment marks are formed) is satisfied. In view of the above, it is preferable to maintain a larger distance D and dispose of the alignment marks at the locations near the respective centers of the segments, i.e., the locations satisfying L1=L4 and L3=L5 in FIG. 10.

While the invention has been described with reference to the structures disclosed herein, it is not confined to the details set forth and this application is intended to cover such modifications or changes as many come within the purposes of the improvements or the scope of the following claims.

What is claimed is:

1. An alignment and exposure method comprising the steps of:
    placing a workpiece on a holder having first and second alignment marks;
    placing a first mask having a third alignment mark, which is alignable with the first alignment mark of the holder, so that the first mask is opposed to a first region of the workpiece;
    aligning the first mask and the first region of the workpiece by use of the first and third alignment marks;
    exposing the first region of the workpiece to an exposure beam transmitted through the first mask;
    placing a second mask having a fourth alignment mark, which is alignable with the second alignment mark of the holder, so that the second mask is opposed to a second region of the workpiece, the second region being contiguous to the first region of the workpiece;
    aligning the second mask and the second region of the workpiece by use of the second and the fourth alignment marks; and
    exposing the second region of the workpiece to an exposure beam transmitted through the second mask.

2. An alignment and exposure method, comprising the steps of:
    forming first and second alignment marks on a workpiece having a surface region onto which a pattern having first and second portions is to be transferred, in such a manner that the first alignment mark is close to a first portion of the surface region of the workpiece while the second alignment mark is close to a second portion of the surface region of the work piece;
    using the first alignment mark in order to position the first portion of the surface region of the workpiece relative to the first portion of the pattern;
    exposing the first portion of the surface region of the workpiece to the first portion of the pattern with radiation in order to transfer the first portion of the pattern onto the first portion of the surface region of the workpiece;
    using the second alignment mark in order to position the second portion of the surface region of the workpiece relatively to the second portion of the pattern; and
    exposing the second portion of the surface region of the workpiece to the second portion of the pattern with radiation in order to transfer the second portion of the pattern onto the second portion of the surface region of the workpiece, whereby the transferred first and second portion of the pattern are interrelated in the surface region.

* * * * *

UNITED STATES PATENT AND TRADEMARK OFFICE
CERTIFICATE OF CORRECTION

PATENT NO. : 4,883,359

DATED : November 28, 1989

INVENTOR(S) : HIDEKI INA, ET AL.

It is certified that error appears in the above-identified patent and that said Letters Patent is hereby corrected as shown below:

On the title page:

IN [30] FOREIGN APPLICATION PRIORITY DATA

"Feb. 28, 1984 [JP] Japan .......... 59-35322" should read --Feb. 28, 1984 [JP] Japan ..........59-35332--.

IN [56] REFERENCES CITED

U.S. PATENT DOCUMENTS, "Takehashi et al." should read --Takahashi et al.--.

FOREIGN PATENT DOCUMENTS, "54-134565 10/1975 Japan" should read --54-134565 10/1979 Japan--.

IN [57] ABSTRACT

Line 11, "is aligned" should read --are aligned--.

COLUMN 3

Line 21, "mask" should read --mark--.

COLUMN 4

Line 4, "preferred" should read --predetermined--.

COLUMN 5

Line 30, "trasferred" should read --transferred--.

UNITED STATES PATENT AND TRADEMARK OFFICE
CERTIFICATE OF CORRECTION

PATENT NO. : 4,883,359

DATED : November 28, 1989

INVENTOR(S) : HIDEKI INA, ET AL.

It is certified that error appears in the above-identified patent and that said Letters Patent is hereby corrected as shown below:

COLUMN 8

Line 1, "many" should read --may--.
Line 39, "work piece;" should read --workpiece;--.

Signed and Sealed this

Twenty-fourth Day of September, 1991

Attest:

Attesting Officer

HARRY F. MANBECK, JR.

Commissioner of Patents and Trademarks